United States Patent
Margules (10) Patent No.: US 6,901,127 B1
(45) Date of Patent: May 31, 2005

(54) METHOD AND APPARATUS FOR DATA RECOVERY

(75) Inventor: Michael A Margules, Reno, NV (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/558,901

(22) Filed: Apr. 26, 2000

(51) Int. Cl.$^7$ ................................................. H04L 7/02
(52) U.S. Cl. ....................... 375/361; 375/376; 375/282
(58) Field of Search ................................ 375/360, 361, 375/373, 376, 282; 370/509, 512, 514

(56) References Cited

U.S. PATENT DOCUMENTS

| | | | | |
|---|---|---|---|---|
| 4,142,070 A | * | 2/1979 | Landauer et al. | 370/513 |
| 4,453,260 A | * | 6/1984 | Inagawa et al. | 375/362 |
| 5,181,227 A | * | 1/1993 | DeLuca et al. | 375/342 |
| 5,479,456 A | * | 12/1995 | Rhebergen | 375/361 |
| 5,726,650 A | * | 3/1998 | Yeoh et al. | 341/70 |
| 6,088,414 A | * | 7/2000 | Dove et al. | 375/376 |

* cited by examiner

Primary Examiner—Young T. Tse
Assistant Examiner—Qutbuddin Ghulamali
(74) Attorney, Agent, or Firm—Garlick, Harrison & Markison, LLP; Timothy W. Markison (57) ABSTRACT

A method and apparatus for recovering data by a digital audio interface, where the data may be transmitted over a single transmission path in accordance with the AES3-1992 standard, begins by receiving a stream of biphase encoded data. The biphase encoded data is organized as a series of data block that each include a plurality of frames. The processing continues by determining whether a next transition of a frame of the plurality of frames occurs during a first, second, or third time window after a preceding transition of the frame. When the next transition occurs during the second predetermined time, the digital audio interface synchronizes to a data rate of the stream of biphase encoded data based on the next transition and the preceding transition. In other words, the transitions of the data within the frame are occurring at the data rate. (Note that biphase encoding encodes a logic zero as no transition during a clock interval, encodes a logic one as a transition during a clock interval, and provides a transition at the next clock interval to indicate a new bit). If, the next transition occurs during the first or third predetermined windows, the digital audio interface synchronizes to a data rate of the stream of biphase encoded data based on the preceding transition edge and a subsequent transition. For example, when the next transition occurs during the first time window, the transition is representative of a logic one, where the subsequent transition corresponds to the beginning of the next bit. When the transition occurs during the third time window, the biphase encoding is violated, which indicates that a preamble is being received.

20 Claims, 5 Drawing Sheets

METHOD AND APPARATUS FOR DATA RECOVERY

TECHNICAL FIELD OF THE INVENTION

This invention relates generally to data recovery techniques and more particularly to data recovery in digital audio interface devices.

BACKGROUND OF THE INVENTION

As is known, a compact disc (CD) stores digital audio data that is read by a CD player. The CD player, which may be a standalone device, such as a portable compact disc player, part of an audio system, or contained within a personal computer, renders the digital audio data into audible signals. To ensure that a CD player can play various CDs, standards have been established to prescribe the digital encoding and data rates of audio signals.

One such standard, AES3-1992, —established by the audio engineering society (AES)—provides guidelines for transmitting digital audio data over a single transmission line. In general, digital audio is serially communicated over a single transmission line in data blocks. Each data block is comprised of a plurality of frames (for example, 192). Each frame, in turn, is comprised of two preambles, two data channels, control information, and error detection information. The preambles delineate the two data channels within a frame, where the first preamble of a first frame of new block is unique to identify the beginning of the new block. The AES3-1992 further prescribes that the digital audio data is to be biphase encoded, with the preambles being violations of the biphase encoding.

The digital audio data may be transmitted at a data rate of 32 kHz, 44.1 kHz, 48 kHz, or 96 kHz, depending on the audio application. For example, digital video discs (DVD), which digitize audio in accordance with Dolby AC-3 technologies, use a 96 kHz data rate. In addition, the system clock a digital audio interface may be 256, 384, or 512 times the sampling frequency, which is selectable via control data. As such, an AES3-1992 compliant transmitter and/or receiver must be able to process digital audio at any of the data rates and using any of the selectable clock frequencies.

Therefore, a need exists for a method and apparatus for interfacing digital audio in accordance with the AES3-1992 standard.

DETAILED DESCRIPTION OF A PREFERRED EMBODIMENT

Generally, the present invention provides a method and apparatus for recovering data by a digital audio interface, where the data may be transmitted over a single transmission path in accordance with the AES3-1992 standard, and further revisions thereof. Such processing begins by receiving a stream of biphase encoded data. The biphase encoded data is organized as a series of data block that each include a plurality of frames. The processing continues by determining whether a next transition of a frame of the plurality of frames occurs during a first, second, or third time window after a preceding transition of the frame. When the next transition occurs during the second predetermined time, synchronizing to a data rate of the stream of biphase encoded data based on the next transition and the preceding transition. In other words, the transitions of the data within the frame are occurring at the data rate. (Note that biphase encoding encodes a logic zero as no transition during a clock interval, encodes a logic one as a transition during a clock interval, and provides a transition at the next clock interval to indicate a new bit). If, the next transition occurs during the first or third predetermined windows, synchronizing to a data rate of the stream of biphase encoded data based on the preceding transition edge and a subsequent transition. For example, when the next transition occurs during the first time window, the transition is representative of a logic one, where the subsequent transition corresponds to the beginning of the next bit. When the transition occurs during the third time window, the biphase encoding is violated, which indicates that a preamble is being received. With such a method and apparatus, data having one of a plurality of data rates and is biphase encoded can be readily decoded and subsequently utilized. The present method and apparatus is particularly useful in digital audio interfaces that process digital audio data, which has been encoded based on the AES3-1992 standard.

Figure 1:
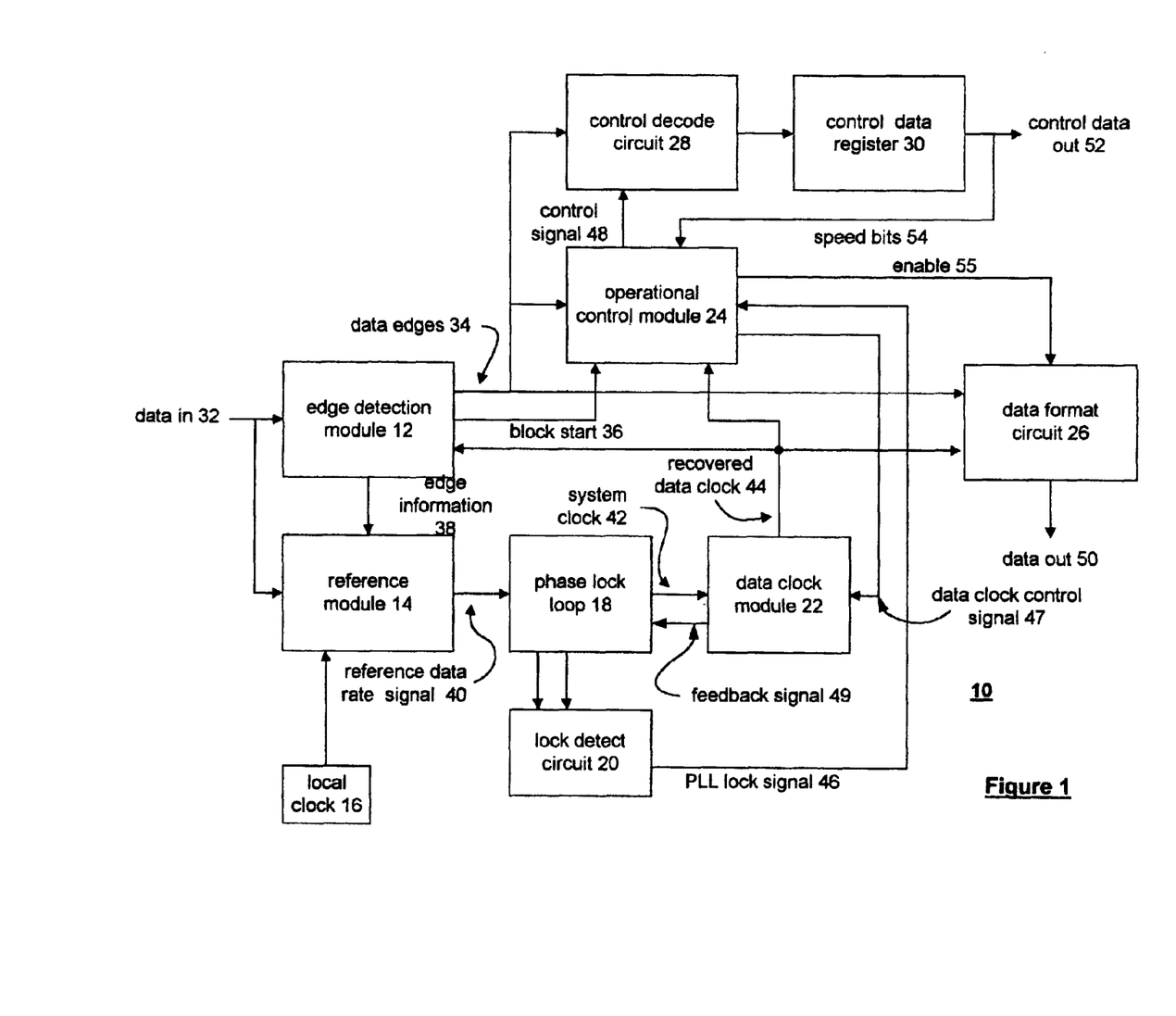
FIG. 1 illustrates a schematic block diagram of a data recovery circuit in accordance with the present invention.

The present invention can be more fully described with reference to FIGS. 1 through 5. FIG. 1 illustrates a schematic block diagram of a data recovery circuit 10 that includes an edge detection module 12, a reference module 14, a local clock 16, a phase lock loop 18, a lock detect circuit 20, a data clock module 22, an operational control module 24, a data format circuit 26, a control decode circuit 28, and a control data register 30. The edge detection 12 is operably coupled to receive biphase encoded data 32. The edge detection module 12 detects transitions within the biphase encoded data 32 to generate edge information 38. The edge information is provided to a reference module 14 that, based on the edge information 38, generates a reference data rate signal 40. In addition, the reference module 14 may also receive a local clock signal from a local clock generator 16. If the local clock generator circuit 16 is provided, the phase lock loop 18 operates as a stand-alone clock circuit. Without the clock circuit 16, the phase lock loop operates in a normal mode, i.e., data recovery mode. The phase lock loop 18 generates a system clock 42 based on the reference data rate signal 40. The clock module 22 receives the system clock 42 and produces therefrom a recovered data clock rate 44, a frame clock rate, and a block clock rate. The edge detection module 12 receives the recovered data clock signal 44, the block clock rate, and the frame clock rate and, utilizing the clock signals, generates a block start signal 36. In addition, the edge detection module 12 outputs indications of the data edges, or transitions, 34 of the biphase encoded data.

The operational control module 24 controls extraction of control information from the data 32. As is known, the data 32 includes, within each frame, control information that indicates channel status. The channel status includes length of audio sample words, number of audio channels, sampling frequency, sample address code, alphanumeric source and destination codes, and emphasis. In general, the operational control module 24 provides a control signal 48 to the control decode circuit 28, which indicates to the control decode circuit 28 when it should interpret the data edges 34. As the control decode circuit 28 interprets the data edges 34, it determines the particular channel status settings and stores them in the control data register 30. For example, as the control decode circuit 28 interprets the sampling frequency, it stores the sampling frequency as speed bits 54 in the control data register 30. As is known, the speed bits 54 may be representative of a 32 kHz, 44.1 kHz, 48 kHz, or 96 kHz sampling rate.

The operational control module 24 also controls operation of the data recovery circuit 10. To this end, the operational control module 24 receives the block start signal 36, the data edges 34, a phase lock signal 46, and the recovered data clock signal 44 and interprets these inputs to generate a data clock control signal 47. The data clock control signal 47 is an indication as to whether the system clock 42 and the dependent clocks (i.e., recovered data clock, frame rate clock, and block clock) are at a rate comparable to the data clock rate. As such, the data clock control signal 47 may be for a coarse adjustment, fine adjustment, or low jitter (e.g., steady state) operation of the PLL 18. The data clock module 22 receives the data clock control signal 47 and produces therefrom a feedback signal 49, which causes the PLL 18 to adjust the system clock 42 accordingly. As the system clock 42 stabilizes, the lock detection circuit 20 generates the PLL lock signal 46. Generally, the lock detection circuit 20 compares the phase difference between the feedback signal 49 and the reference data rate signal 40. When the phase difference is below a threshold, the lock detection circuit 20 generates the PLL lock signal 46 to indicate that the PLL operation is locked, i.e., the system clock has stabilized. The PLL lock signal 46 is then interpreted by the operational control module 24 to determine whether the PLL has coarsely locked, finely locked, or is in a steady state condition.

When the PLL has reached a steady state condition, or is at least finely locked, the operational control module 24 determines whether the speed bits 54 indicate the same data rate 44 as the recovered data rate. If not, the operational control module 24 re-determines whether the PLL 18 has at least finely locked. If the PLL has not finely locked, the operational control module 24 waits until the PLL is finely locked. Once this occurs, the operational control module 24 re-determines whether the recovered data clock 44 substantially matches the data rate indicated by the speed bits. When the recovered data rate 44 substantially matches the sampling frequency indicated by the speed bits 54, the operational control module 24 generates an enable signal 55. As such, when the enable signal 55 is active, the operational control module 24 has determined that incoming data 32 is valid.

The data format circuit 26 is operably coupled to receive the enable signal 55, the data edges 34 and the recovered clock signal 44. Based on these inputs, the data format circuit 26 generates a digital output 50. As such, the data edges are interpreted to determine whether the bit for the current data bit interval (i.e., the inverse of the data clock rate) is a 1 or a 0. As is known, biphase encoded data represents a 1 by having a transition occur within the current data bit interval and represents a 0 by not having a transition occur within the current data bit interval. At the next data bit interval, a transition occurs, thereby substantially eliminating a DC component of the data.

Figure 2:
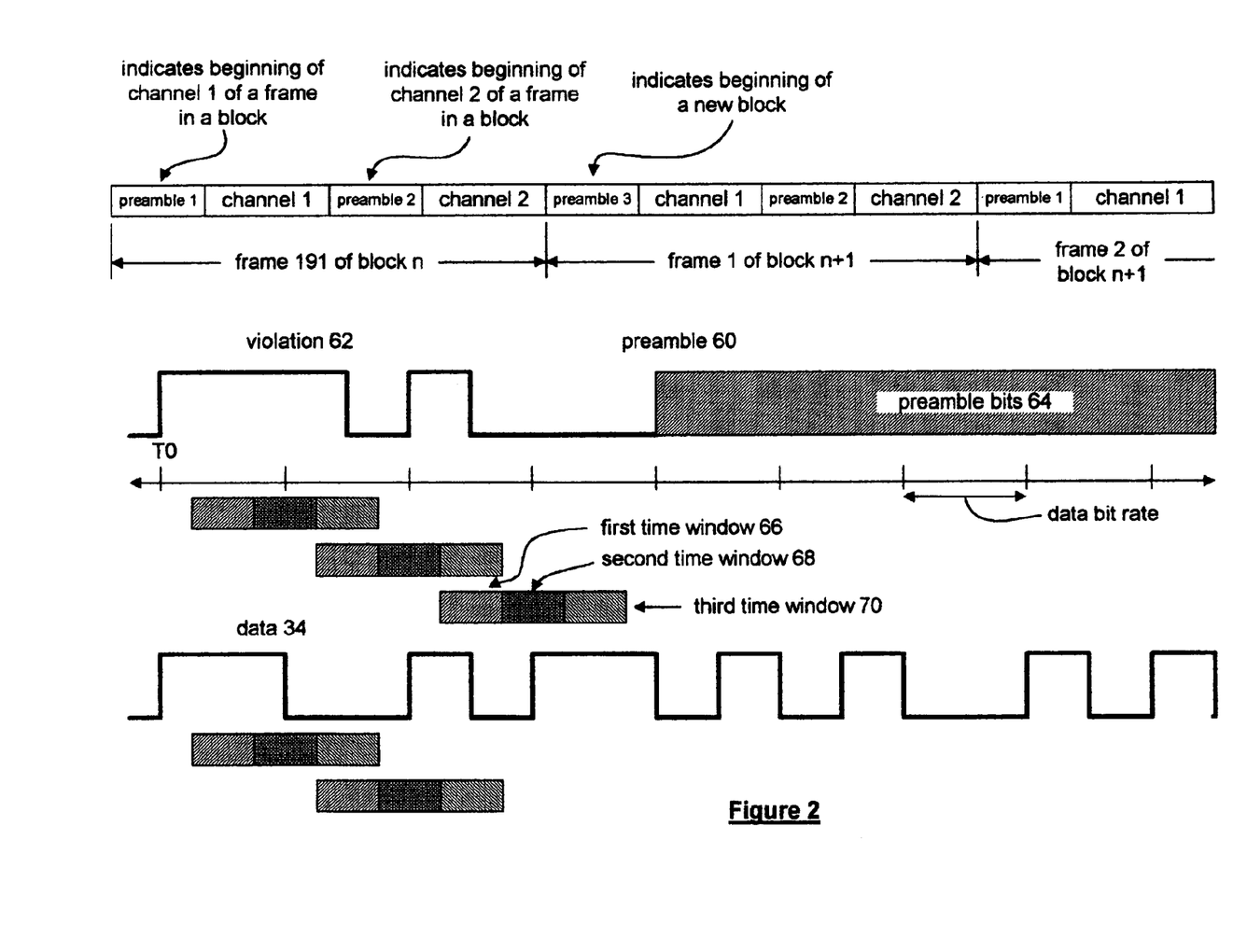
FIG. 2 illustrates a graphical representation of the data recovery process of the data recovery circuit of FIG. 1.

FIG. 2 illustrates a graphical representation of processing the biphase encoded data by the data recovery circuit 10 of FIG. 1. As shown, a data stream includes a plurality of blocks, where each block includes 192 frames. Each frame, in turn, includes a pair of channels, preambles to delineate the channels, control information, and error correction information. As shown, preamble 1 indicates the beginning of channel 1 of frame 191 of block "n" and preamble 2 indicates the beginning of channel 2 of frame 191 in block "n". The first and second preambles are used to delineate the first and second channels within each frame, except the first frame of a new block. In the first frame of a new block, a third preamble indicates the first channel of a first frame of a new block.

Each of the preambles 60 includes a violation portion 62 and preamble bits 64. The preamble bits indicate whether the preamble is a first preamble, second preamble, or third preamble. The violation indicates that a preamble is being transmitted. To detect whether data or a preamble is being transmitted, a series of time windows are used to determine when a transition occurs. As shown, the series of time windows includes a first time window 66, a second time window 68, and a third time window 70. The time windows are sequential in time and synchronized with the beginning of a transition edge of a data bit interval. For example, the first time window may be 0.25*(data bit rate) to 0.75*(data bit rate), the second time window may be 0.75*(data bit rate) to 1.25*(data bit rate), and the third time window may be 1.25*(data bit rate) to 1.75*(data bit rate).

As an illustrative example, the time windows are shown in relation to the preamble 60 and the data 34. In relation to the preamble 60, the first time window 66 begins shortly after a transition at a data bit interval boundary. During the first time window, the data format circuit 26, the edge detection module 12, the operational control module 24, and/or the reference module 14, determine whether a transition occurs during the first time window. Note that the data format circuit 26 performs such a comparison to decode the data, while at least one of the other modules 12, 14, and 24 perform the comparison for data clock recovery, preamble detection, and/or valid data detection. When the first time window 66 elapses and no transition is detected, the second time window 68 begins. If no transitions are detected during the second time window, as is the case of this example, the third time window 70 commences. When a transition occurs within the third time window, the transition is recorded and subsequently used to determine that a biphase encoding violation has occurred. Such a violation indicates that a preamble is being transmitted.

Once a transition has been detected, the next series of time windows is activated in synchronization with the transition. The transition detection process is repeated for the new series of time windows. As shown, a transition occurs during the first time window, which is recorded. The third series of time windows is begun in synchronization with the current transition. As can be seen, a transition again occurs during the first time window, which is recorded. At this point, a fourth series of time windows is begun. As also can be seen, a transition occurs during the third time window. Thus, a pattern of 3, 1, 1, 3 was recorded for the transitions during the violation 62. This pattern is interpreted to identify a biphase encoding violation and, as such, the beginning of a preamble 60. As one of average skill in the art will appreciate, the commencement of the series of time windows may occur at the boundaries of the data bit interval. With such an embodiment, the resulting pattern of transition occurrences is 3, 1, 1, 2, which can be interpreted to be a biphase encoding violation.

In relation to the data 34, the series of time windows begin at $T_0$, as illustrated with reference to the violation 62, the transition occurs during the third time window 70 which indicates that the preamble is beginning. The next series of time windows begins at the next data bit interval. At this point, a transition occurs during the first time window 66 and is subsequently recorded. At the next increment of the data bit rate, another series of time windows is commenced. During this series of time windows, a transition occurs during the second time window 68. Based on this pattern, the edge detection circuit 12 can delineate the beginning of a preamble. The preamble bit 64, as prescribed by the AES3-1992 standard provides a particular bit pattern to indicate preamble 1, preamble 2, or preamble 3. The first preamble may be represented by the bit pattern of 11100010, the second preamble represented by the bit pattern of 111100100 and the third preamble represented by the bit pattern of 11101000.

To detect data, the series of time windows are again employed. At the beginning of each data bit rate interval, the series of time windows commences. As shown with respect to the data wave form 34, the first series of time windows commences at the positive transition of a data element. As shown, a transition occurs during the second time window 68. Based on the transition occurring during this time, the data format circuit 26 interprets this to be a logic zero. At the down transition of the data, another series of time windows commences. As shown here, the next transition again occurs during the second time window. This indicates that the next bit in the series of any data stream is also a logic zero. During the next data bit interval, a transition occurs during the first time window indicating that the bit being transmitted is a logic 1. As can be seen in the pattern provided with respect to the data signal 34, the bit pattern being transmitted is 001011011.

To provide a data synchronization technique that synchronizes on the data bit rate, one can see that transition edges that occur during the violation 62 or during the transmission of a logic one, should not be used by the phase lock loop to generate the system clock, which is subsequently used to generate the recovered data clock signal 44. As such, these transitions need to be masked such that only transitions that occur at the boundaries of the data bit rate interval are provided to the phase lock loop 18. The reference module 14 includes circuitry to mask provision of the non-boundary transitions of the data bit rate.

Figure 3:
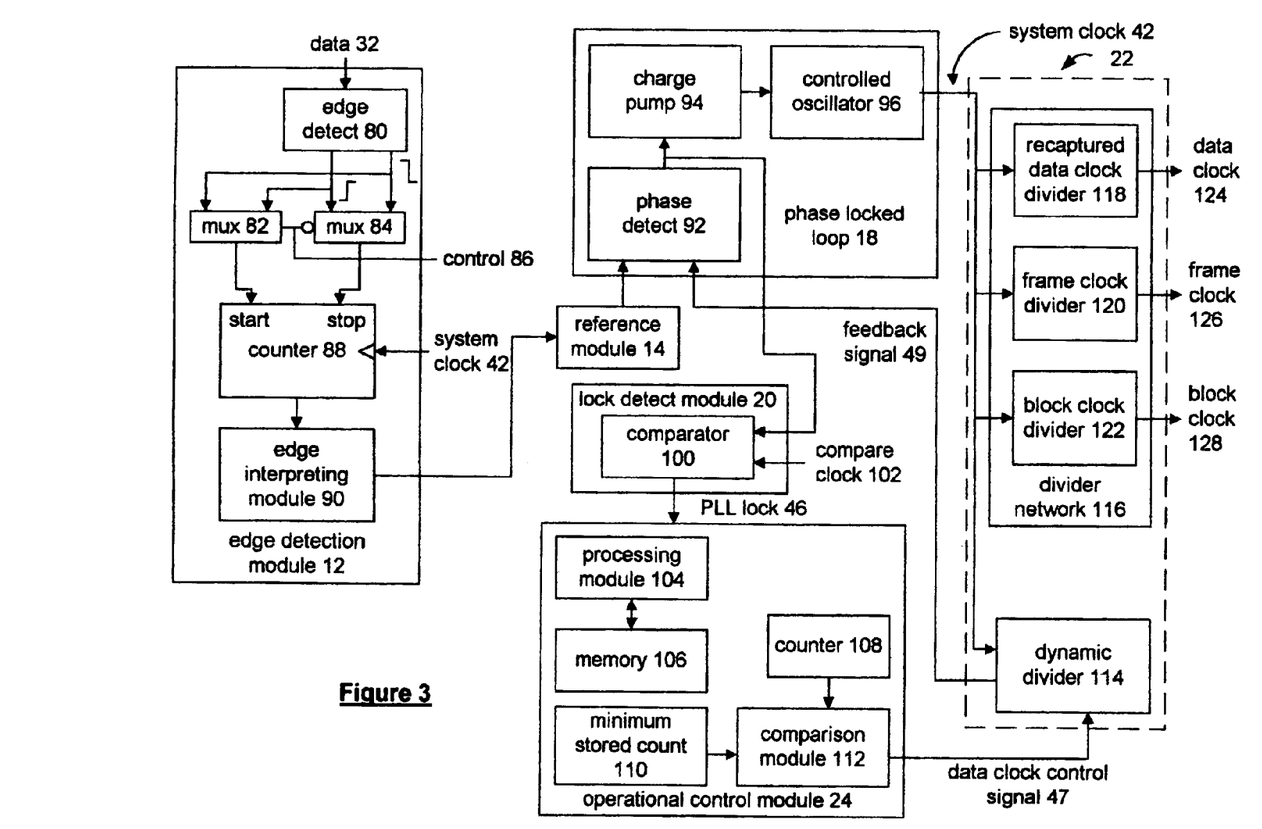
FIG. 3 illustrates a more detailed schematic block diagram of elements of the data recovery circuit of FIG. 1.

FIG. 3 illustrates a more detailed schematic block diagram of the edge detection module 12, the operational control module 24, the phase lock loop 18, the lock detect module 20 and the data clock module 22. The data clock module 22 includes a dynamic divider 114 and a divider network 116. The divider network, in turn, includes a recaptured data clock divider 118, a frame clock divider 120 and a block clock divider 122. Each of these dividers 118, 120 and 122 are operably coupled to receive the system clock 42 and to generate a data clock 124, a frame clock 128, and a block clock 128, respectively.

The edge detection module 12 includes an edge detect circuit 80, multiplexors 82 and 84, a counter 88, and an edge interpreting module 90. The edge detection circuit is operably coupled to receive the data stream 32 and detect a positive transition and a negative transition. Such transitions are provided as inputs to multiplexors 82 and 84. Based on a control signal 86, which is generated by the operational control module, a counter is started and stopped based on the transition edges. The counter counts the number of cycles of the system clock 42 that occurs between the transitions. The count result is provided to the edge interpreting module 90 which compares the number of cycles occurring between the transition edges with the series of time windows. Note that the duration of the first, second and third time windows will vary depending on the data rate of the incoming data signal. For example, when the data rate is 32 kilohertz, the data bit rate interval is 31.25 microseconds. As such, the first time window may commence at 7.5 microseconds and continue through 23.5 microseconds. At 23.5 microseconds after the beginning of the data bit rate, the second time window begins and would continue until 39 microseconds. At this point, the third time window would commence and would end at 55 microseconds. As one of average skill in the art would readily appreciate, the duration of the time windows may vary from the example given provided that the first time window is established to capture a transition that occurs during the data bit rate interval. The second time window is established to capture the transition at the boundary of the data bit rate and the third time window is established to capture the violation which indicates the beginning of a preamble.

The edge interpreter module 90 outputs the edge information 38 to the reference module 14, which in turn generates the referenced data rate 40. The phase lock loop receives the referenced data rate signal 40 via a phase detect circuit 92. The phase detect circuit 92 also receives a feedback signal 98 from the dynamic divider 114. Based on these inputs, the phase detect circuit generates a charge up or charge down signal which is provided to the charge pump 94. The charge pump, in turn, generates an input and provides it to a control oscillator 96, which in turn generates the system clock 42. The dynamic divider 114 may be a resistive network, or transistor network that provides a plurality of varying divider ratios. The dynamic divider is typically designed to mimic the capture data clock rate divider 118. By utilizing the dynamic divider 114 to generate the feedback signal 98, the operational control module 24 has greater control over the generation of the clock signals with minimal interference to the clock signals provided to the data recovery elements (e.g., the edge detection circuit 12 and the data format circuit 26).

The operational control module 24 includes a processing module 104, memory 106, a minimum store count register 110, a comparison module 112 and a counter 108. The processing module 104 may be a single processing entity or a plurality of processing entities. Such a processing entity may be a microprocessor, microcontroller, digital signal processor, microcomputer, state machine, logic circuitry and/or any device that manipulates digital signals. The memory 106 may be a single memory device or a plurality of memory devices. Such a memory device may be a read-only memory, random access memory, floppy disk memory, hard disk memory, system memory, magnetic tape memory, and/or any device that stores digital information. Note that if the processing module implements one or more of its functions via a state machine or logic circuitry, the memory storing the corresponding operational instructions is embedded within the circuitry comprising the state machine or logic circuit. The operational instructions stored in memory 106 and executed by processing module 104 are discussed in greater detail with reference to FIGS. 4 and 5.

In general, the operational control module generates a data clock control signal 47 to establish a steady state condition of the system clock signal 42. Once in a steady state condition, the operational control module 24 provides the enable signal to the data format circuit (see FIG. 1) such that the data being received can be properly decoded. The counter 108 functions similarly to the counter 88 of the edge detection module. In essence, the counter counts the number of cycles that occurs between transitions and determines whether that equates to a minimum store count. The comparison module 112 is determining whether the transition corresponds to a data bit rate boundary, a bit transition, or a violation transition. The operational control module is attempting to determine that the minimum count value stored in the register 10 equates to a data transition during the data bit rate interval. In other words, the minimum stored count equates to data, a logic 1 being transmitted in which the count equates to the time for one-half of the data bit rate.

Since the incoming data is not marked as to its data rate, the operational control module 24 must determine whether 32 kilohertz data, 44.1 kilohertz data, 48 kilohertz data, or 96 kilohertz data is being transmitted. Thus, by utilizing the minimum stored count to identify a data transition representative of a logic 1, the operational control module can determine the corresponding data rate. The corresponding data rate is then verified based on the speed bits 54 (see FIG. 1).

The lock detect module 20 includes a comparitor 100 that compares a comparison clock with the phase different signal outputted by the phase detection circuit 92. In essence, the comparitor 100 is detecting whether the charge up or charge down signal has occurred within a prescribed period of time surrounding a bit rate interval boundary. If such is the case, the comparitor flags that the phase lock loop 18 is locked via PLL lock signal 46. The comparison clock 102 may have two settings, a coarse setting and a fine setting. The coarse setting indicates that the phase lock loop is within a coarse threshold of a steady state condition and the fine setting is indicating that the system clock 42 is within a fine threshold of a steady state condition. The changing of the compare clock 102 is controlled by the operational control module 24 via the data clock control signal 47.

Figure 4:
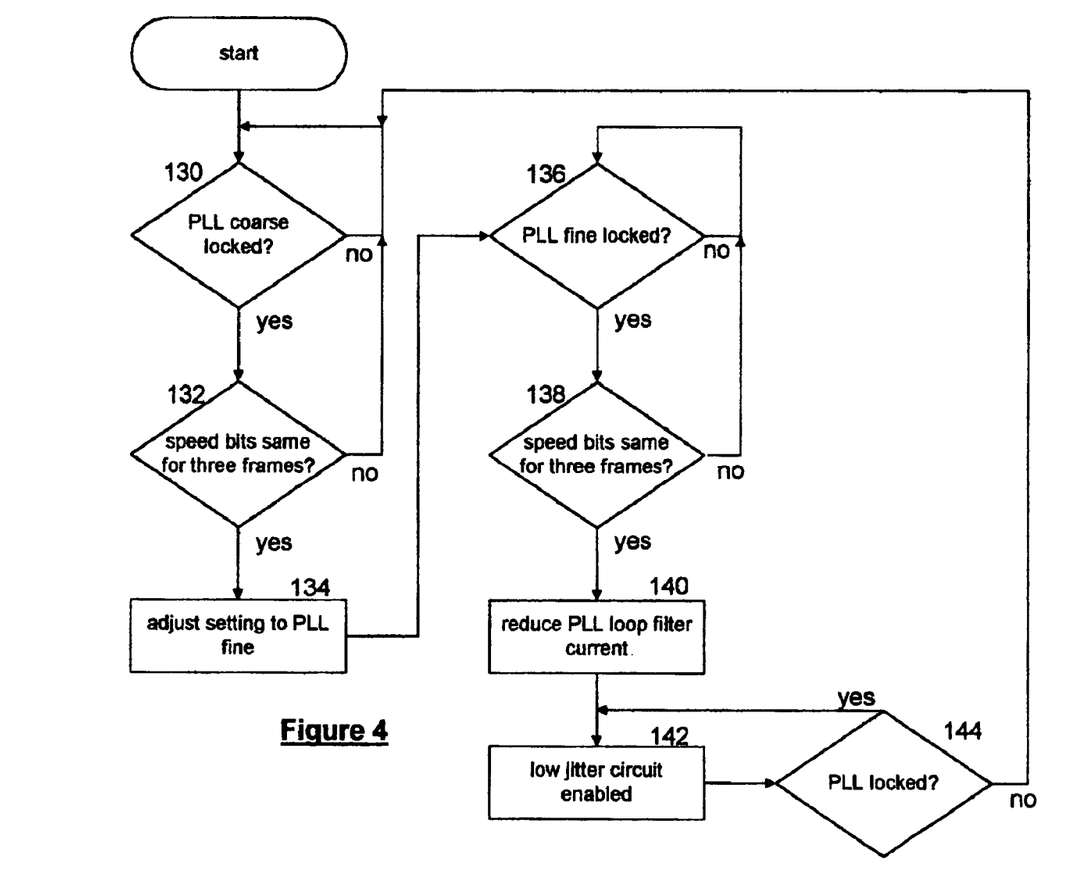
FIG. 4 illustrates a logic diagram for a method of recovering data in accordance with the present invention.

FIG. 4 illustrates a logic diagram of a method executed by the operational control module 24. The process begins at step 130 where a determination is made as to whether the phase lock loop has achieved a coarse lock. If not, the process waits until the phase lock loop has achieved a coarse lock. Once the coarse lock has been obtained, the process proceeds to step 132 where a determination is made as to whether the speed bits are the same for three consecutive frames. If not, the process waits until three consecutive speed bits are the same.

The process then proceeds to step 134 where the threshold setting of the phase lock loop is adjusted to a fine setting. The process then proceeds to step 136 where a determination is made as to whether the phase lock loop has obtained the fine lock. Once it has, the process proceeds to step 138 where a determination is made as to whether the speed bits for three frames remain the same. Once this occurs, the process proceeds to step 140 where the phase lock loop filter current is reduced. The process then proceeds to step 142 where a low jitter circuit is enabled and remains in this condition as long as the phase lock loop remains locked. If the phase lock loop falls out of the locked condition, the process reverts to step 130.

Figure 5:
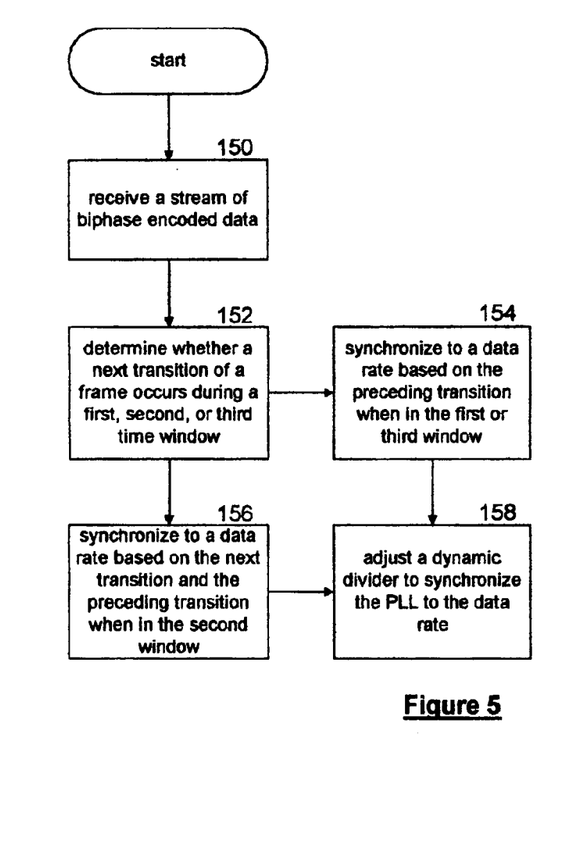
FIG. 5 illustrates an alternate method for recovering data in accordance with the present invention.

FIG. 5 illustrates a logic diagram of a method for data recovery in accordance with the present invention. The process begins at step 150 where a stream of biphase encoded data is received. The process then proceeds to step 152 where a determination is made as to whether a next transition of a frame occurs during a first, second or third time window. Such a determination may be made by counting a number of clock cycles of an output (e.g., the system clock) of the phase lock loop that occur between the preceding transition and the next transition. The next transition occurs during the first time window when the number of clock cycles was in a first range, occurs during the second time window when the number of clock cycles is in a second range, and is in the third time window when the number of clock cycles is in a third range. The number of clock cycles in each range will depend on the particular data rate being synced.

When the next transition occurs during the second time window, the process proceeds to step 156 where the data rate is synchronized based on the next transition and the preceding transition. This was illustrated with reference to FIG. 2. If, however, the next transition occurred during the first or third time window, the process proceeds to step 154 where the data rate is synchronized based on the preceding transition and a subsequent transition. When the transition occurs during the first or third time window the transition is masked (i.e., not provided) to the phase lock loop. If, however, it occurs in the second time window, the transition is provided to the phase lock loop such that the phase lock loop may synchronize to the transition edges that occur at the boundaries of the data bit rate.

The process then proceeds to step 158 from steps 154 or 156. At step 158, a dynamic divider is adjusted to synchronize the phase lock loop to the data rate. Adjusting the dynamic divider may be based on the data rate and an output of the phase lock loop to produce a divider. Where the recovered data clock rate is based on the output of the phase lock loop (i.e., the system clock) and the divider produced by the dynamic divider. Adjustment of the dynamic divider may further be described with reference to logic steps 160 through 176. At step 160, a determination is made as to whether the phase lock loop is locked. If not, the process proceeds to step 162 where a determination is made as to whether the stored minimum count is less than a predetermined value. If so, the rate of the phase lock loop is decreased and the process repeats at step 160. If the stored minimum count is not less than the predetermined value, the rate of the phase lock loop is increased and the process repeats at step 160. The processing at step 160 through 166 are performed by the operational control module to determine the data rate of the incoming biphase data signal. As previously mentioned, the incoming data rate may be 32 kilohertz, 44.1 kilohertz, 48 kilohertz or 96 kilohertz. The stored minimum count is a number used to count the number of system clock cycles that occur during a logic one transition. As such, if the stored minimum count falls below the predetermined value, the phase lock loop is running too fast thus needs to be decreased. Alternatively if the stored minimum count is greater than the predetermined value, the phase lock loop is running too slow, thus it needs to be increased. As such, if the stored minimum count is less than the predetermined value the phase lock loop is running too slowly thus it needs to be increased. Conversely, if the stored minimum count exceeds the predetermined value, the phase lock loop is running too fast and needs to be decreased.

Once the phase lock loop is locked, the process proceeds to step 168 where a current count of cycles outputted by the phase lock loop is determined. The process then proceeds to step 170 where this count is compared with a stored minimum count. The process then proceeds to step 172 where a determination is made as to whether the comparison was favorable. If not, the process proceeds to step 174 where the stored minimum count is decremented. If the comparison was favorable, the stored minimum count is incremented at step 176. As such, the steps of 168–176 are utilized to maintain the synchronization of the current data rate via the dynamic divider.

The preceding discussion has presented a method and apparatus for data recovery. Such a method and apparatus are particularly useful in recovering digital audio that has been transmitted in accordance with the AES3-1992 standard. As one of average skill in the art would appreciate, the modules shown in FIGS. 1 and 3 may be implemented within a processing entity, as previously described, or as discrete components. As one of average skill in the art will further appreciate, other embodiments may be derived from the teachings of the present invention without deviating from the scope or the spirit of the claimed present invention.

What is claimed is:

1. A method for data recovery, the method comprises:
   a) receiving a stream of biphase encoded data, wherein the stream of biphase encoded data includes a plurality of frames;
   b) determining whether a next transition of a frame of the plurality of frames occurs during a first, second, or third time window after a preceding transition of the frame;
   c) synchronizing to a data rate of the stream of biphase encoded data based on the next transition and the preceding transition when the next transition occurs during the second time window indicating a valid data rate transition;
   d) masking the next transition when the next transition occurs within the first or third time window, the masking to prevent synchronization to an indication of a state change or to a presence of a preamble, both of which would provide synchronization to incorrect data rate transition;
   providing the next transition to a phase lock loop, when the next transition occurs within the second time window; and
   synchronizing, by the phase locked loop, to a data rate of the stream of biphase encoded data based on the next transition and the preceding transition.

2. The method of claim 1 further comprises:
   adjusting a dynamic divider based on the data rate and an output of the phase locked loop to produce a divided clock; and
   producing a recovered data clock based on the output of the phased locked loop and the divider.

3. The method of claim 2, wherein the adjusting the dynamic divider comprises:
   determining a current count based on a number of clock cycles of the output of the phase locked loop that occur during a frame of the stream of biphase encoded data;
   comparing the current count with a stored minimum count; and
   decrementing the stored minimum count when the current count compares unfavorably to the stored minimum count.

4. The method of claim 3 further comprises:
   incrementing the stored minimum count when the current count compares favorably to the stored minimum count.

5. The method of claim 3 further comprises:
   maintaining the stored minimum count when the current count matches the stored minimum count.

6. The method of claim 3 further comprises, prior to the phase locked loop being locked:
   determining whether the stored minimum count is less than a predetermined value;
   decreasing a rate of the phase locked loop when the stored minimum count is less than the predetermined value.

7. The method of claim 3 further comprises, prior to the phase locked loop being locked:
   determining whether the stored minimum count is greater than a predetermined value; and
   increasing a rate of the phase locked loop when the stored minimum count is greater than the predetermined value.

8. The method of claim 1, wherein (b) further comprises:
   counting a number of clock cycles of an output of the phase locked loop that occur between the preceding transition and the next transition;
   determining that the next transition occurs during the first time window when the number of clock cycles is in a first range;
   determining that the next transition occurs during the second time window when the number of clock cycles is in a second range; and
   determining that the next transition occurs during the third time window when the number of clock cycles is in a third range.

9. A data recovery circuit comprises:
   an edge detection module operably coupled to receive a stream of biphase encoded data, wherein the edge detection module detects edges of the stream of biphase encoded data and generates edge type information, and wherein the biphase encoded data includes a plurality of frames, the edge detection module including:
   (a) a counter that counts a number of clock cycles of a system clock between consecutive edges of the stream of biphase encoded data; and
   (b) an edge interpreting module operably coupled to receive the number of clock cycles and to determine, therefrom, whether a current transition edge corresponds to at least one of: a clock edge, a data edge, and a preamble edge to produce the edge type information;
   a reference module operably coupled to receive the stream of biphase encoded data and the edge type information and to produce, therefrom, a reference data rate signal;
   a phase locked loop (PLL) operably coupled to produce the system clock based on the reference data rate signal;
   a lock detect module operably coupled to the phase locked loop, wherein the lock detect module generates a lock signal when the phase locked loop is in a steady state condition;
   an operational control module operably coupled to receive the lock signal, the edges of the stream of biphase encoded data, and a recovered data clock and produces therefrom, a data clock control signal;
   a data clock module operably coupled to receive the system clock and the data clock control signal and to produce, therefrom, the recovered data clock; and
   a data format module operably coupled to receive the edges of the stream of biphase encoded data, the lock signal, and the recovered data clock and to produce, therefrom, an output data stream.

10. The data recovery circuit of claim 9, wherein the reference module is further operably coupled to generate an edge skip signal when the edge type information indicates that the current transition edge is one of the data edge and the preamble edge.

11. The data recovery circuit of claim 9, wherein the data clock module comprises a dynamic divider, wherein the dynamic divider divides, based on the data clock control signal, the system clock to produce a representation of a recaptured data clock.

12. The data recovery circuit of claim 11, wherein the data clock module further comprises a divider network to produce the recaptured data clock, a frame clock, and a block clock.

13. The data recovery circuit of claim 9, wherein the data clock control signal comprises at least one of: coarse clock adjust, fine clock adjust, and restart clock adjust.

14. The data recovery circuit of claim 9, wherein the operational control module comprises:
   a counter operably coupled to count the number of clock cycles of the system clock for a frame of the stream of biphase encoded data; and
   a comparison module operably coupled to receive the number of clock cycles, wherein the comparison module compares the number of clock cycles with a minimum stored count and produces, therefrom, the data clock control signal.

15. The data recovery circuit of claim 9, wherein the lock detect module comprises a comparator operably coupled to compare phase of the reference data rate signal with phase of a feedback signal against a PLL lock clock, wherein the PLL lock clock includes at least one of: a fine setting and a coarse setting.

16. A data recovery circuit comprises:
   a processing module; and
   memory operably coupled to the processing module, wherein the memory includes operational instructions that cause the processing module to: (a) receive a stream of biphase encoded data, wherein the stream of biphase encoded data includes a plurality of frames; (b) determine whether a next transition of a frame of the plurality of frames occurs during a first, second, or third time window after a preceding transition of the frame; (c) synchronize to a data rate of the stream of biphase encoded data based on the next transition and the preceding transition when the next transition occurs during the second time window indicating a valid data rate transition; (d) mask the next transition when the next transition occurs within the first or third time window, the mask to prevent synchronization to an indication of a state change or to a presence of a preamble, both of which would provide synchronization to incorrect data rate transition; and provide the next transition to a phase locked loop when the next transition occurs within the second time window, such that the phase locked loop is synchronized to a data rate of the stream of biphase encoded data based on the next transition and the preceding transition.

17. The data recovery circuit of claim 16 further comprises a dynamic divider and, wherein the memory further includes operational instructions that cause the processing module to:
   provide an adjustment signal to the dynamic divider based on the data rate and an output of the phase locked loop, such that the dynamic divider produces a divided clock; and
   produce a recovered data clock based on the output of the phased locked loop and the dynamic divider.

18. The data recovery circuit of claim 17, wherein the memory further includes operational instructions that cause the processing module to produce the adjustment signal by:
   determining a current count based on a number of clock cycles of the output of the phase locked loop that occur during a frame of the stream of biphase encoded data;
   comparing the current count with a stored minimum count;
   decrementing the stored minimum count when the current count compares unfavorably to the stored minimum count, wherein the adjustment signal is representative of the stored minimum count;
   incrementing the stored minimum count when the current count compares favorably to the stored minimum count; and
   maintaining the stored minimum count when the current count matches the stored minimum count.

19. The data recovery circuit of claim 17, wherein the memory further includes operational instructions that cause the processing module to, prior to the phase locked loop being locked:
   determine whether the stored minimum count is less than a predetermined value;
   provide a decrease rate signal to the phase locked loop when the stored minimum count is less than the predetermined value.

20. The data recovery circuit of claim 17, wherein the memory further includes operational instructions that cause the processing module to, prior to the phase locked loop being locked:
   determine whether the stored minimum count is greater than a predetermined value; and
   provide an increase rate signal to the phase locked loop when the stored minimum count is greater than the predetermined value.

* * * * *